(12) United States Patent
Kuthi et al.

(10) Patent No.: US 7,632,375 B2
(45) Date of Patent: Dec. 15, 2009

(54) ELECTRICALLY ENHANCING THE CONFINEMENT OF PLASMA

(75) Inventors: Andras Kuthi, Thousand Oaks, CA (US); Jisoo Kim, Pleasanton, CA (US); Eric Lenz, Pleasanton, CA (US); Rajindar Dhindsa, San Jose, CA (US); Lumin Li, Fremont, CA (US); Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 555 days.

(21) Appl. No.: 11/024,978

(22) Filed: Dec. 30, 2004

(65) Prior Publication Data

US 2009/0165954 A1    Jul. 2, 2009

(51) Int. Cl.
C23F 1/00 (2006.01)
H01L 21/306 (2006.01)

(52) U.S. Cl. .................................. 156/345.1; 156/915
(58) Field of Classification Search ................. 156/915
See application file for complete search history.

(56) References Cited

U.S. PATENT DOCUMENTS

| | | | | |
|---|---|---|---|---|
| 4,483,737 A * | 11/1984 | Mantei | .......................... | 438/732 |
| 5,252,178 A | 10/1993 | Moslehi | | |
| 5,316,645 A * | 5/1994 | Yamagami et al. | ..... | 204/298.06 |
| 5,534,751 A | 7/1996 | Lenz et al. | | |
| 5,904,800 A | 5/1999 | Mautz | | |
| 5,998,932 A | 12/1999 | Lenz | | |
| 6,019,060 A | 2/2000 | Lenz | | |
| 6,178,919 B1 | 1/2001 | Li et al. | | |
| 6,244,211 B1 * | 6/2001 | Nishikawa et al. | ..... | 118/723 AN |
| 6,281,469 B1 * | 8/2001 | Perrin et al. | ........... | 219/121.43 |
| 6,375,860 B1 | 4/2002 | Ohkawa et al. | | |
| 6,423,176 B1 | 7/2002 | Ito et al. | | |
| 6,492,774 B1 * | 12/2002 | Han et al. | ............... | 315/111.21 |
| 6,579,425 B2 * | 6/2003 | Voutsas et al. | ......... | 204/192.23 |
| 6,602,381 B1 * | 8/2003 | Lenz | ....................... | 156/345.1 |
| 6,872,281 B1 | 3/2005 | Chen et al. | | |
| 2001/0037770 A1 * | 11/2001 | Otsubo | ................ | 118/723.001 |
| 2001/0047760 A1 * | 12/2001 | Moslehi | ................ | 118/723.001 |
| 2002/0005348 A1 * | 1/2002 | Xu et al. | ................. | 204/192.12 |
| 2002/0067133 A1 * | 6/2002 | Brown et al. | ........... | 315/111.51 |
| 2003/0008492 A1 * | 1/2003 | Jung et al. | ................... | 438/624 |
| 2003/0037881 A1 * | 2/2003 | Barnes et al. | .......... | 156/345.44 |
| 2004/0094402 A1 * | 5/2004 | Gopalraja et al. | ...... | 204/192.12 |
| 2005/0016684 A1 * | 1/2005 | Sun et al. | ................ | 156/345.51 |

* cited by examiner

Primary Examiner—Michael Cleveland
Assistant Examiner—Keath T Chen
(74) Attorney, Agent, or Firm—Lowe Hauptman Ham & Berner LLP

(57) ABSTRACT

A vacuum plasma processor includes a chamber having a grounded wall and an outlet port. Plasma is excited at a first RF frequency in a chamber region spaced from the wall and outlet port. A structure confines the plasma to the region while enabling gas to flow from the region to the outlet port. RF electric power at a second frequency connected to the confining structure causes the confining structure to be at a potential different from ground to increase the size of a sheath between the plasma and confining structure and increase the confining structure effectiveness. The region includes an electrode connected to ground by a circuit that is series resonant to the first frequency and includes capacitance of the sheath.

50 Claims, 6 Drawing Sheets

ELECTRICALLY ENHANCING THE CONFINEMENT OF PLASMA

FIELD OF THE INVENTION

The present invention relates generally to plasma processors and more particularly to a plasma processor including a confined plasma region having an electrically powered confinement structure

BACKGROUND ART

Vacuum plasma processors are used to deposit materials on and etch materials from workpieces that are typically semiconductor, dielectric and metal substrates. A gas is introduced into a vacuum plasma processing chamber where the workpiece is located. The chamber pressure is typically in the range of 0.1 to 1000 torr. The gas is ignited into an RF plasma in response to an RF electric or electromagnetic field. The RF field is provided by a reactive impedance element, usually either an electrode array or a coil which couples both magnetic and electrostatic RF fields to the gas. The reactive impedance element is connected to a first RF source having a first relatively high RF frequency and sufficient power such that the gas is ignited into the plasma. Typically, the gas is introduced into the chamber through the top of the chamber and is withdrawn from the bottom of the chamber. It is common for an electrode at the top of the chamber to be associated with a series of baffles and openings into the excitation region to provide a shower head effect for the gas flowing into the excitation region. The workpiece is usually mounted on an electrode at the bottom of a plasma excitation region in the chamber. In some chambers, the electrode carrying the workpiece is the reactive impedance element supplied with the first RF frequency and a second usually top, electrode spaced from the electrode carrying the workpiece is connected to a reference potential, typically ground. In other chambers the top electrode is supplied with a second RF frequency. It is known to provide such a chamber with an exterior metal wall arrangement at a reference potential, e.g., ground, and a plasma confinement region spaced from the exterior wall, i.e., within the interior of the chamber.

The plasma confinement region includes a structure, such as ring shaped louvers, designed to prevent plasma from flowing from the region and permit uncharged gas molecules to flow from the confinement region. The uncharged gas molecules flow through one or more gaps between opposed facing adjacent surfaces in the vicinity of the periphery of the confinement region. From the gap(s), the uncharged gas flows in a region of the chamber between the confinement region and the chamber wall to an outlet of the chamber connected to a vacuum pump.

A sheath that does not include charge particles and has a thickness determined by the plasma density is formed between the confinement region gap(s) and the plasma. The spacing of the gap(s) between adjacent pairs of the ring shaped louvers is such that the sheath has a thickness that extends entirely through the gap(s) between the adjacent pairs of louvers. As a result, charge particles are not incident on the chamber exterior wall, to (1) provide better control of the plasma in the confinement region and a cleaner chamber outside the confinement region, and (2) reduce damage to the portion of the chamber exterior to the confinement region as result of the plasma not being incident on these portions of the chamber.

It is known, however, that in a typical prior art plasma processor having a confinement region there are occasional losses of plasma confinement, i.e., plasma is present in the portion of the chamber between the exterior of the confinement region and the chamber wall. The loss of plasma confinement is usually due to (1) direct transport of plasma through the gap(s) and/or (2) plasma generation outside the ring shaped louvers, i.e., confinement rings. Reasons (1) and (2) are correlated through the leaking plasma being effectively an RF electrode that carries the RF potential of the plasma through the gap(s) from the confinement region to the chamber region between the exterior of the confinement region and the chamber wall. Presumably, in the absence of plasma leakage through the confinement structure gap(s) there is not enough RF voltage outside the confinement region to ignite the gas outside the confinement region to form a plasma.

To establish a sheath having the necessary thickness to absolutely prevent loss of plasma confinement with the typical prior art confinement structure, the separation between facing surfaces of the gaps between adjacent pairs of louvers is frequently so narrow that there is a considerable gas flow impedance between the interior of the confinement region and the portion of the chamber outside the confinement region. Consequently, the flow rate of gas flowing into and out of the confinement region is frequently less than optimum.

It is, accordingly, an object of the present invention to provide a plasma processor having a new and improved confinement region.

Another object of the invention is to provide a new and improved method of operating a plasma processor to provide enhanced confinement of plasma to a region spaced from the chamber wall.

A further object of the invention is to provide a plasma processor having a confinement region having a lower gas flow impedance, i.e., greater gas flow conductance, between the interior of the confinement region and the portion of the chamber outside the confinement region without adversely affecting plasma confinement within the region.

An additional object of the invention is to provide a new and improved method of operating a plasma processor having a confinement region, wherein the plasma processor is operated so there is a lower gas flow impedance, i.e., greater gas flow conductance, between the interior of the confinement region and the portion of the chamber outside the confinement region without adversely affecting plasma confinement within the region.

An added object of the invention is to provide a plasma processor having a new and improved confinement region with at least one gap, wherein the spacing between opposed facing adjacent surfaces of the gap(s) is increased without adversely affecting plasma confinement within the region.

Yet another object of the invention is to provide a new and improved method of operating a plasma processor having a confinement region with at least one gap, wherein the plasma processor is operated in such a manner that the spacing between opposed facing adjacent surfaces of the gap(s) can be increased without adversely affecting plasma confinement within the region.

SUMMARY OF THE INVENTION

In accordance with one aspect of the invention, a vacuum plasma processor comprises a processing chamber having (1) a wall at a reference potential (e.g. ground), (2) an outlet port, (3) a region spaced from the wall and outlet port in which a plasma is excited, and (4) a structure for confining the plasma to the region and having gaps for enabling gas to flow through from the region to the outlet port. An electric power source connected to the confining structure causes a boundary of the gaps in the confining structure to be at a potential different from the reference potential.

A further aspect of the invention relates to a method of operating a vacuum plasma processor including a processing chamber having (1) a wall at a reference potential, (2) outlet port, (3) a region spaced from the wall and outlet port, and (4) a structure for confining plasma to the region while enabling gas to flow from the region to the outlet port. The method comprises exciting a plasma in the region and applying a potential different from the reference potential to the confining structure while the plasma is excited in the region.

A sheath has a tendency to be formed between the plasma and boundary of gap(s) in the confining structure. The electric power source and the confining structure are preferably arranged so there is an increase in the size of the sheath within the confining structure gap(s) compared to the size of the sheath that is formed between the plasma and the confining structure gap(s) without the electric power source being connected to the confining structure.

The electric power source preferably includes an AC source that is applied to a boundary of a gap in the confining structure to prevent charge carriers in the confinement region from being formed into a plasma.

To prevent ionization of gas in the gaps by the electric power source, preferably (1) the frequency is an RF frequency less than about 4 MHz, and (2) the electric fields in the gaps between opposed adjacent facing surfaces of the gaps are less than about 3 volts/meter.

To assist in preventing the escape of plasma from the confining structure, AC power applied to the confining structure in certain embodiments has plural phases such that the voltage applied to the confining structure always includes a component having a value different from the reference potential. The power applied to the confining structure preferably includes two phases separated by 90 degrees or three phases separated by 120 degrees.

The confining structure preferably includes an insulating member surrounding and concentric with the region where the plasma is adapted to be excited. The member preferably carries three or four electrical conductors concentric with the region. In the two phase embodiment, there are three conductors; one of the conductors surrounds the remaining conductors and is connected to the reference potential. The remaining conductors are connected to be responsive to the two different phases of electric power. In the three phase embodiment, there are four conductors; one of the conductors is connected to the reference potential and each of the three remaining conductors is electrically connected to a different one of each of the three phases. To provide the necessary electrical isolation between the conductor and the plasma and between the conductors and the other structures in the chamber, the conductor carrying member is made of a dielectric and the conductors are covered by a dielectric.

The confinement structure generally includes plural louvers in stacked relationship. Each of the louvers surrounds and is concentric with the region where the plasma is adapted to be excited. In certain embodiments, the louvers carry circular electrodes that are connected to an AC source, that can supply single or plural phases to the electrodes on the louvers.

The region where the plasma is excited includes a first electrode driven by an AC source having a first frequency, different from the AC frequency applied to the confirming structure. The first electrode electrically couples the first frequency to the plasma in the region. A series resonant circuit is preferably electrically connected between (1) a second electrode that faces the first electrode and (2) a terminal at the reference potential. The second electrode and the resonant circuit are arranged so that capacitance of the sheath between the confinement structure and the plasma is included in the resonant circuit. Because the resonant circuit is of the series type and has a resonant frequency equal approximately to the first frequency, the resonant circuit has a low impedance for the first frequency. This arrangement helps to prevent escape of the first frequency from the confinement region to assist in further preventing plasma formation between the chamber wall and confining structure.

Voltage applied to the confinement structure is preferably controlled in response to the width of the confinement structure gaps.

A further aspect of the invention relates to a vacuum plasma processor and method of operating same, wherein the processor includes a processing chamber having (1) a wall at a reference potential, (2) an outlet port, (3) a region spaced from the wall in which a plasma is adapted to be excited, and (4) a structure for confining the plasma to the region while enabling gas to flow from the region to the outlet port. The region where the plasma is excited includes first and second electrodes electrically coupled with the plasma in the region. A source coupled to the first electrode excites the plasma to an AC frequency. A resonant circuit is electrically connected between the second electrode and a terminal at the reference potential. The second electrode and the resonant circuit are such that capacitance of a sheath between the plasma and the second electrode is included in the resonant circuit that has a resonant frequency equal approximately to the AC frequency of the source.

DETAILED DESCRIPTION OF THE DRAWING

Figure 1:
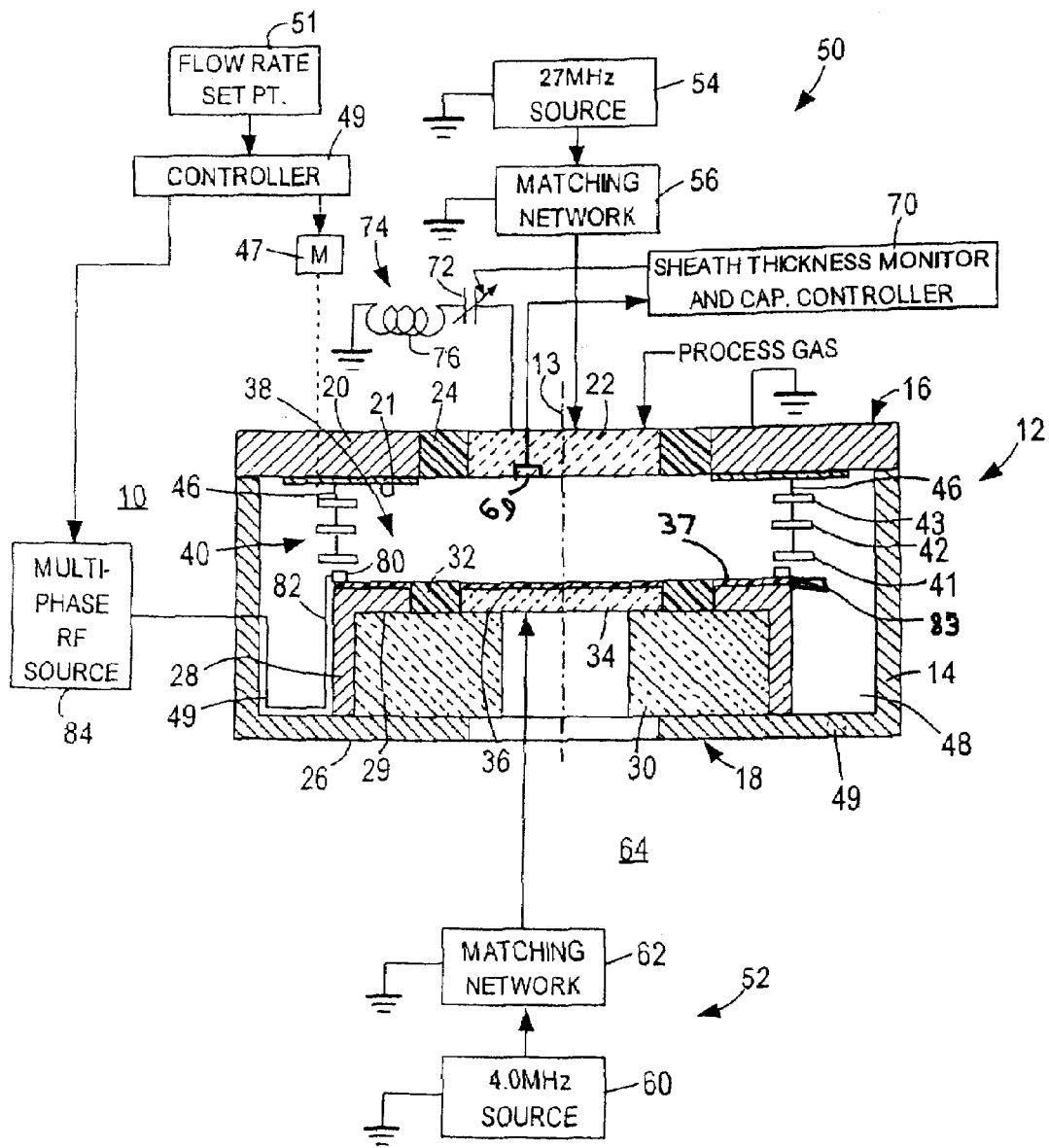
FIG. 1 is a schematic, cross-sectional diagram of a plasma processor including the features of preferred embodiments of the invention, wherein plural ring-shaped electrodes on a stationary structure are supplied with plural RF phases.

Reference is now made to FIG. 1 of the drawing wherein plasma processor 10 is illustrated as including vacuum chamber 12, preferably having a cylindrical configuration so that the chamber is symmetrical with respect to its central longitudinal axis 13. Chamber 12 includes high electrical conductivity, cylindrical metal sidewall 14 maintained at RF and DC reference potential (e.g. ground), as well as circular ceiling 16 and circular base 18. Ceiling 16 includes annular exterior high electrical conductivity metal plate 20 which carries on its lower face high electrical conductivity ring 21. Plate 20 and ring 21 are electrically and mechanically connected to wall 14 so that plate 20 and ring 21 are also at RF and DC ground potential. Ceiling 16 also includes circular, electrode 22 and annular electric insulator 24 that separates and electrically insulates electrode 22 from plate 20. Plate 20, ring 21, electrode 22 and insulator 24 are coaxial with axis 13.

Base 18 includes annular exterior metal plate 26, electrically and mechanically connected to wall 14 so that plate 26 is also at RF and DC ground potential. Plate 26 carries high electrical conductivity metal ring 28, that projects into chamber 12 and is mechanically and electrically connected to plate 26 so that the ring is also at RF and DC ground potential. Ring 28 carries high electrical conductivity flange 29 that extends radially inwardly of chamber 12 so that the flange is parallel to base plate 26 and is at RF and DC ground potential. Plate 26 also carries tubular electric insulator 30 having an exterior sidewall contacting the interior sidewall of ring 28 and an upper face bearing the lower face of flange 29. The upper face of insulator 30 also carries electric insulator ring 32 and circular electrode 34 for carrying workpiece 36, which is preferably a semiconductor wafer, but can be a dielectric or metal substrate. Ring 32 electrically insulates electrode 34 from flange 29, by virtue of the flange having exterior and interior edges respectively abutting the interior edge of flange 29 and the exterior edge of electrode 34. Electrode 34 is frequently arranged as an electrostatic chuck connected to a DC chucking voltage source (not shown), in which case electrode 34 includes an arrangement (not shown) for cooling workpiece 36 while the workpiece is being processed by plasma in chamber 12. The co-planar upper face of ring 28 and flange 29 carry insulator ring 37, preferably made of quartz. Ring 37 extends from the outer perimeter of ring 32 to the outer perimeter of ring 28 and has an upper face that is somewhat below the upper face of workpiece 36, when the workpiece is chucked to electrode 34. Plate 26, ring 28, flange 29, insulator 30, ring 32, electrode 34, and ring 37 are coaxial with axis 13 and have circular perimeters; when workpiece 36 is properly in place on electrode 34 the workpiece is also coaxial with axis 13.

Process gas from a suitable source (not shown) is introduced into plasma excitation region 38 through electrode 22, which includes a series of baffles and openings so that the process gas flows into region 38 with a showerhead effect. In plasma excitation region 38, the process gas is converted into the plasma which processes workpiece 36. The process gas is converted into plasma in response to electric fields that electrodes 22 and 34 respectively couple to the excitation region at relatively high and low frequencies; in a preferred embodiment the high and low frequencies are respectively about 27 MHz and 4.0 MHz. The amount of power at the high frequency supplied to electrode 22 primarily controls the density of the plasma in excitation region 38, while the amount of power at the low frequency supplied to electrode 34 primarily controls the ion energy in the plasma. While the low and high frequencies are preferably 4.0 MHz and 27 MHz, it is to be understood that other and more than two suitable frequencies which control the plasma density and ion energy, as well as other parameters of the plasma, can be employed.

Plasma excitation region 38, which is coaxial with axis 13, is spaced from sidewall 14 by virtue of the region including louver arrangement 40. In one embodiment, the louvers of arrangement 40 are grounded for DC and RF, and include three vertically stacked, electrically grounded circular rings 41-43, having high electrical conductivity. Grounded rings 41-43, as well as rings 21 and 29, are preferably made of silicon carbide doped to have a high electrical conductivity on the order of $2 \times 10^3$ ohm-centimeters and able to withstand the harsh environment of the plasma in region 39. Grounded rings 41-43 can be made of other materials having high electrical conductivity, e.g., aluminum or graphite. Grounded rings 41-43 are electrically and mechanically connected by metal posts 46 to grounded metal plate 20. Grounded rings 41-43, which are coaxial with axis 13 and fixedly positioned relative to each other, have aligned outer edges that are outside the outer perimeter of ring 28 and aligned inner edges that are inside the outer perimeter of ring 28.

The electrical grounding of rings 41-43 assists in confining the plasma to region 38 within the louvers. The mechanical relation of rings 41-43 also assists in confining the plasma while enabling gas that is no longer ionized or which was not ionized in region 38 to flow in a generally horizontal direction through the openings between the rings. The gas flows through the space between rings 41-43 into annular passage 48 that is coaxial with axis 13 and includes inner and outer walls respectively defined by the exterior wall of ring 28 and the interior of wall 14. Thus, region 38 can be considered as a plasma confinement region which is spaced from chamber wall 14.

The bottom of passage 48 is connected by opening 249 in plate 26 to a conduit (not shown), in turn connected to a pump (not shown) which sucks the gas from the interior of chamber 12 and maintains the chamber interior outside region 38 at a vacuum, typically having a value less than 50 millitorr, and preferably about 5 to 10 millitorr. The pressure in region 38 is typically considerably higher, e.g. 20 to 500 millitorr.

To assist in providing the required plasma confinement for different pressure and gas flow conditions between region 38 and the remainder of the chamber, i.e., from inside region 38 to outside region 38, the spacing between opposing faces of rings 37 and 41 is varied by motor 47. The variable spacing between rings 37 and 41, which can be achieved with conventional mechanical mechanisms coupled between motor 47 and the louver arrangement 40, helps to determine the gas pressure in region 38 and the rate of gas flow from region 38 to passage 48 so that adjusting the spacing assists in controlling the confinement region pressure, degree of plasma confinement and gas flow rate. Motor 47 is driven by an output signal of controller 49, in turn responsive to a flow rate set point signal from set point source 51.

Plasma excitation region 38 is bounded by electrodes 22 and 34, conducting rings 21 and 29 and insulator rings 24 and 32, as well as louver rings 41-43. The plasma in excitation region 38 is bounded by a sheath of neutral particles that forms a capacitance between the plasma. The plasma generally can be considered as a resistive load on electrodes 22 and 34, and the surfaces defining the boundary of region 38. A DC bias voltage across the sheath is controlled primarily by the sum of the powers at the frequencies supplied to electrodes 22 and 34.

The DC bias and, therefore, the sheath capacitance associated with electrode 34, can be actively controlled by including a DC voltage probe 69 for monitoring the DC voltage between electrode 22 and the plasma. Such a DC voltage probe 69 is part of sheath thickness monitor and capacitor controller 70 that controls the value of variable capacitor 72 of series resonant circuit 74 including inductor 76. The voltage probe 69 also causes controller 70 to derive a signal for controlling power supplied to electrode 34 so that a relatively high DC bias voltage is maintained on all surfaces inside the plasma excitation region.

Circuits 50 and 52 respectively provide the approximately 27 MHz and 4.0 MHz excitation for electrodes 22 and 34. Circuit 50 includes 27 MHz source 54 having sufficient power to energize electrode 22 to excite the gas in region 38 into a plasma state and to provide the desired density for the plasma. Circuit 52 includes 4.0 MHz source 60 having sufficient power to energize electrode 34 to establish a substantial DC bias voltage on electrode 34 and the desired ion energy in the plasma in excitation region 38.

RF sources 54 and 60 respectively drive matching networks 56 and 62 including reactances (not shown) which provide impedance matches between (1) the output impedance of source 54 and the load it drives including electrode 22 and the plasma in region 38, and (2) the output impedance of source 60 and the load it drives, including electrode 34 and the plasma in region 36. Networks 56 and 62 can include variable reactances that are controlled to achieve matching or fixed reactances, in which case the frequencies of sources and 54 and 60 are controlled to achieve matching.

Sheath thickness monitor and capacitance controller 70 responds to the voltage derived by the DC bias monitoring probe 69 on or adjacent electrode 22. Controller 70 converts the DC voltage derived by the probe 69 into a signal indicative of the capacitance of the sheath being monitored by the probe. In response to the signal indicative of the monitored sheath capacitance, controller 70 derives a signal indicative of the capacitance change required in the value of capacitor 72 to achieve series resonance for the frequency of 4 MHz source 60. If source 60 is of the variable frequency type, controller 70 responds to a signal (not shown) indicative of the precise frequency derived by source 60. Controller 70 includes a suitable actuator, such as a motor, for controlling the value of capacitor 72 in accordance with the derived signal indicative of the capacitance change required in the value of capacitor 72.

By controlling capacitor 72 so that series resonance at the frequency of source 60 is achieved in circuit 74 between the plasma in excitation region 38 and ground, a low impedance is provided through circuit 74 between electrode 22 and ground for the frequency of source 60. The series impedance of circuit 74 between electrode 22 and ground for the frequency of source 60 is typically significantly less than the impedance between excitation region 38 and the walls of chamber 12 for the frequency of source 60. Consequently, substantial current from source 60 does not flow from excitation region 38 to the walls of chamber 12 through the gas between the louvers of louver arrangement 40 and between the lower face of louver 41 and the upper face of insulating ring 37. This results in substantial confinement of the 4 MHz energy in the plasma to region 38.

It is be understood that a similar result can be achieved by monitoring the sheath thickness on or adjacent electrode 34 and connecting a second series resonant circuit having a resonant frequency equal to the frequency of 27 MHz source 54 between electrode 34 and ground. The second series resonant circuit would include a variable capacitor having a value controlled by a controller similar to controller 70. It is also to be understood that the series resonant circuits can be achieved by circuit components that are equivalent to the various components of circuit 74.

A substantial increase in the distance between the opposing faces of louvers 41-43 and between the bottom face of louver 41 and the top face of ring 37, without causing plasma ignition outside of confinement region 38, can be achieved by applying electric power to the space (i.e., gaps) between these faces. In particular, application of RF fields without nulls and having a frequency between 400 kHz and 4 MHz enables the distance between the opposing faces to be substantially increased over the situation that is provided without the application of such power. The increase in gap lengths provides a considerably greater flow rate of un-ionized gas from excitation region 38 through the space between the opposing faces of louvers 41-43 and ring 37, as well as an increased flow rate of process gas into region 38 through electrode 22. It is believed that application of such electric fields increases the thickness and length of the sheaths between the opposing faces of louvers 41-43 and between the bottom face of louver 41 and the top face of ring 37. The increased thickness and length of the sheaths appears to reduce the tendency for plasma to escape from excitation region 38 through the gaps between the faces.

The electric fields are derived from electrode array 80, mechanically connected in a fixed manner to the structure that holds workpiece 36. In particular, array 80 is positioned on the upper face and adjacent the outer edge of ring 37 so as to be between the center and interior edge of each of louvers 41-43. Electrode array 80 includes plural concentric, circular electric wires (i.e., conductors or electrodes) that are coaxial with axis 13 and are covered by a suitable dielectric to prevent contamination of the electrodes by the plasma that might be incident on the electrode array. One of the leads of array 80 is grounded, while the remaining leads are connected by cable 82 to multiphase RF source 84. Cable 82 includes a number of leads equal to the number of wires in array 80. Cable 82 has insulation having a first side contacting the leads of the cable and a second side that contacts each of (1) the outer surface of ring 28, (2) the upper, interior face of plate 26 and (3) the interior side of wall 14 so that the leads in cable 82 are in close proximity to but are electrically insulated from the ground potential of ring 28, plate 26 and wall 14. Such an arrangement assists in preventing the leads in cable 82 from picking up stray voltages.

Multiphase RF source 84 has a frequency between 400 kHz and 4 MHz; the frequencies of source 84 must differ significantly from the frequencies of sources 68 or 54. In one preferred embodiment, source 84 has a frequency of 2.0 MHz. If the frequency of source 84 is less than 400 kHz there is a likelihood that the capacitive reactance associated with the wires of array 80 and cable 82 is excessively high, leading to the electrode voltage exceeding the voltage of the sheaths between louvers 41-43 and between the upper face of insulator ring 37 and louver 41. Such a situation can lead to ignition of gas passing through the louver structure, thereby defeating the purpose of the electric fields. If the frequency of source is in excess of 4 MHz, transmission line effects of the grounded lead of array 80 are encountered, such that the grounded lead of array 80 no longer can be considered as an equipotential structure, i.e., not grounded. If the grounded lead of array 80 is not an equipotential structure, the gas passing between louvers 41-43 and between the upper face of insulator ring 37 and louver 41 can also be ignited.

The phases of multiphase RF source 84 are such that there is no null in the electric fields that array 80 applies to the gaps between rings 37 and 41-43, i.e., the voltage applied to array 80 of the confining structure always has a component having a value different from the reference potential of ground. In one embodiment, RF source 84 derives a pair of sine waves that are displaced from each other by 90 degrees and are applied to a pair of interior leads or wires of array 80. In this embodiment, array 80 includes one additional lead that is grounded and outside of the two leads that are energized by source 84 and cable 82 includes three leads connected between source 84 and the wires of array 80. In a second embodiment, RF source 84 derives three sine waves that are displaced from each other by 120 degrees and are applied to three interior wires of array 80. In the second embodiment, array 82 includes a fourth wire that is grounded and outside the three leads that are energized by source 84 and cable 82 includes four leads connected between source 84 and the wires of array 80. The three phase arrangement imparts momentum to the plasma, such that the direction of the momentum depends on the phase sequence instantaneously applied to the wires of array 80.

RF source 84 has a variable voltage amplitude that controller 49 varies in response to an indication of the spacing between the lower face of louver 41 and the upper face of ring 37. The control of the voltage of source 84 can be directly responsive to a signal controller 49 derives in response to the flow rate set point that source 51 supplies to the controller. Alternatively, the spacing between the lower face of louver 41 and the upper face of ring 37 can be monitored by monitor 83 to control the voltage of source 84. As the spacing between the lower face of louver 41 and the upper face of ring 37 increases, the voltage of source 84 increases, to provide electric fields having greater amplitude to the gaps between ring 37 and 41-43. However, the voltage of source 84 cannot be excessively high because the electric fields resulting from a high voltage of the source can result in ignition of the gas into a plasma in the gaps between rings 37 and 41-43. In one embodiment, the maximum voltage and power that source 84 can apply to the energized, i.e., not grounded, wires of array 80 are respectively 300 volts and 50 watts to prevent ignition.

Figure 2:
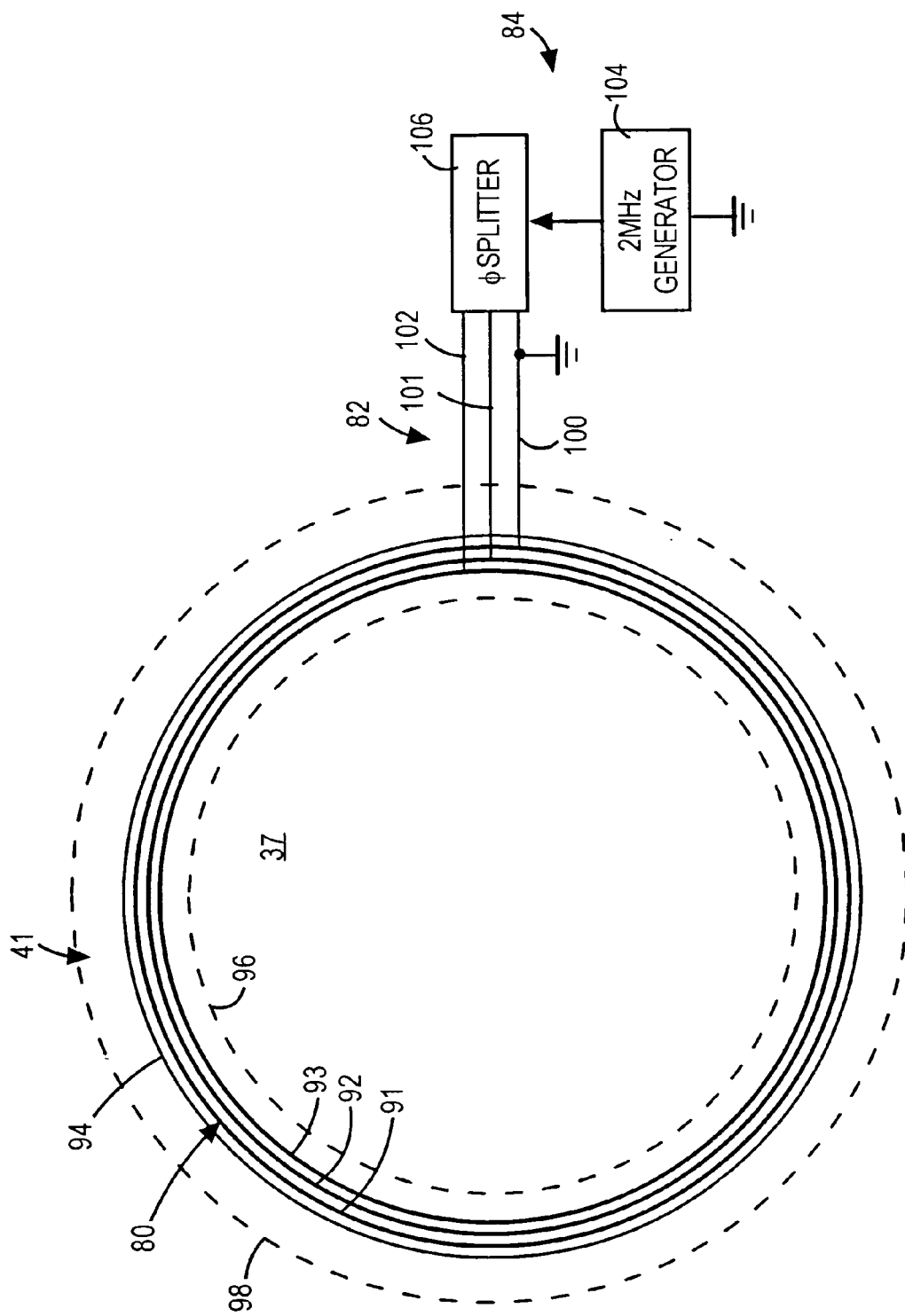
FIG. 2 is a top view of one embodiment of the electrodes in the vacuum plasma processor chamber in FIG. 1.

The two phase embodiment is illustrated in FIG. 2 as comprising three concentric electroplated copper wires, i.e., conductors or electrodes 91, 92 and 93, that form electrode array 80. Electrodes 91-93 are deposited on the top face of ring 37 in proximity to the outer edge 94 of ring 37 (to simplify the drawing the inner edge of ring 37 is not illustrated). Electrodes 91-93 are coaxial with axis 13 and are between the inner and outer edges 96 and 98, respectively, of the lower face of louver 41, such that the electrodes are closer to the inner edge than the outer edge, to provide enhanced plasma confinement. In one particular embodiment, each of electrodes 91, 92 and 93 has a radial extent of about 3 mm, with radial gaps of about 1.5 mm between adjacent pairs of electrodes. Electrodes 91-93 are covered with an insulator; in the particular embodiment, the insulator is Kapton tape having a thickness of about 0.5 mm.

Outer electrode 91 is connected to grounded lead 100 of cable 82, while interior electrodes 92 and 93 are respectively connected to leads 101 and 102 of cable 82. Ring 37 includes plated through holes (not shown) at the same angular position about the periphery of electrodes 91-93. The plated through holes are connected to leads 100-102.

Leads 101 and 102 are connected to multiphase RF source 84 that supplies the interior electrodes 92 and 93 with two RF sine wave voltages that are phase displaced from each other by 90 degrees. RF source 84 includes, in the particular embodiment, 2 MHz generator 104 that drives phase splitter 106, of conventional design. Phase splitter 106 responds to the output of 2 MHz generator 104 to supply leads 101 and 102 with equal amplitude voltages that are phase displaced from each other by 90 degrees and are at the frequency of generator 104. Phase splitter 106 includes a grounded output terminal connected to lead 100. As a result of the two phase excitation of electrodes 92 and 93 and the ground condition of electrode 91, two phase AC electric fields that are 90 degrees phase displaced from each other and are at the frequency of generator 104 are coupled to the gaps between rings 37 and 41-43. Consequently, the combined values of the two phase AC electric fields that are coupled to the gaps between rings 37 and 41-43 never have a null value so that the likelihood of plasma escaping through the gaps is minimized.

Figure 3:
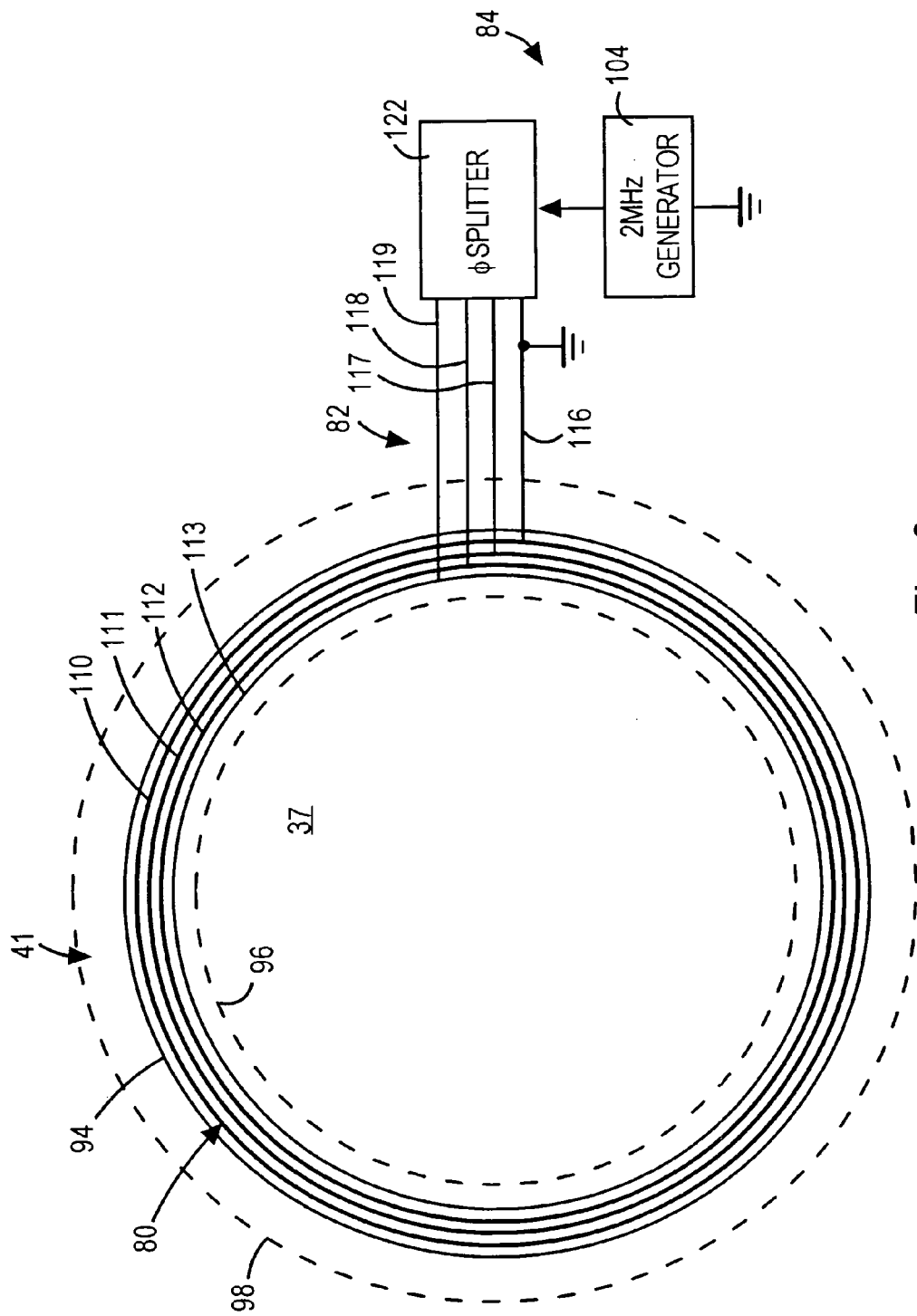
FIG. 3 is a top view of a second embodiment of the electrodes in the vacuum processor chamber illustrated in FIG. 1.

The three phase embodiment is illustrated in FIG. 3 as comprising four concentric electroplated copper wires, i.e., conductors or electrodes 110-113, that form electrode array 80. Electrodes 110-113 are deposited on the top face of ring 37 in proximity to the outer edge 94 of ring 37 (to simplify the drawing the inner edge of ring 37 is not illustrated). Electrodes 110-113 are coaxial with axis 13 and are between the inner and outer edges 96 and 98, respectively, of the lower face of louver 41, such that the electrodes are closer to the inner edge than the outer edge, to provide enhanced plasma confinement. In one particular embodiment, each of electrodes 110-113 has a radial extent of about 3 mm, with radial gaps of about 1.5 mm between adjacent pairs of electrodes. Electrodes 110-113 are covered with an insulator; in the particular embodiment, the insulator is Kapton tape having a thickness of about 0.5 mm.

Outer electrode 110 is connected to grounded lead 116 of cable 82, while interior electrodes 111, 112 and 113 are respectively connected to leads 117, 118 and 119 of cable 82. Ring 37 includes plated through holes (not shown) at the same angular position about the periphery of electrodes 110-113. The plated through holes are connected to leads 116-119.

Leads 117-119 are connected to multiphase RF source 84 that supplies the interior electrodes 111, 112 and 113 with three RF sine wave voltages that are phase displaced from each other by 120 degrees. RF source 84 includes, in the particular embodiment, 2 MHz generator 104 that drives phase splitter 122, of conventional design. Phase splitter 122 responds to the output of 2 MHz generator 104 to supply leads 117-119 with equal amplitude voltages that are phase displaced from each other by 120 degrees and are at the frequency of generator 104. Phase splitter 122 includes a grounded output terminal connected to lead 116. As a result of the three phase excitation of electrodes 111-113 and the ground condition of electrode 110, three phase AC electric fields that are 120 degrees phase displaced from each other and are at the frequency of generator 104 are coupled to the gaps between rings 37 and 41-43. Consequently, the combined values of the three phase AC electric fields that are coupled to the gaps between rings 37 and 41-43 never have a null value so that the likelihood of plasma escaping through the gaps is minimized.

Figure 4:
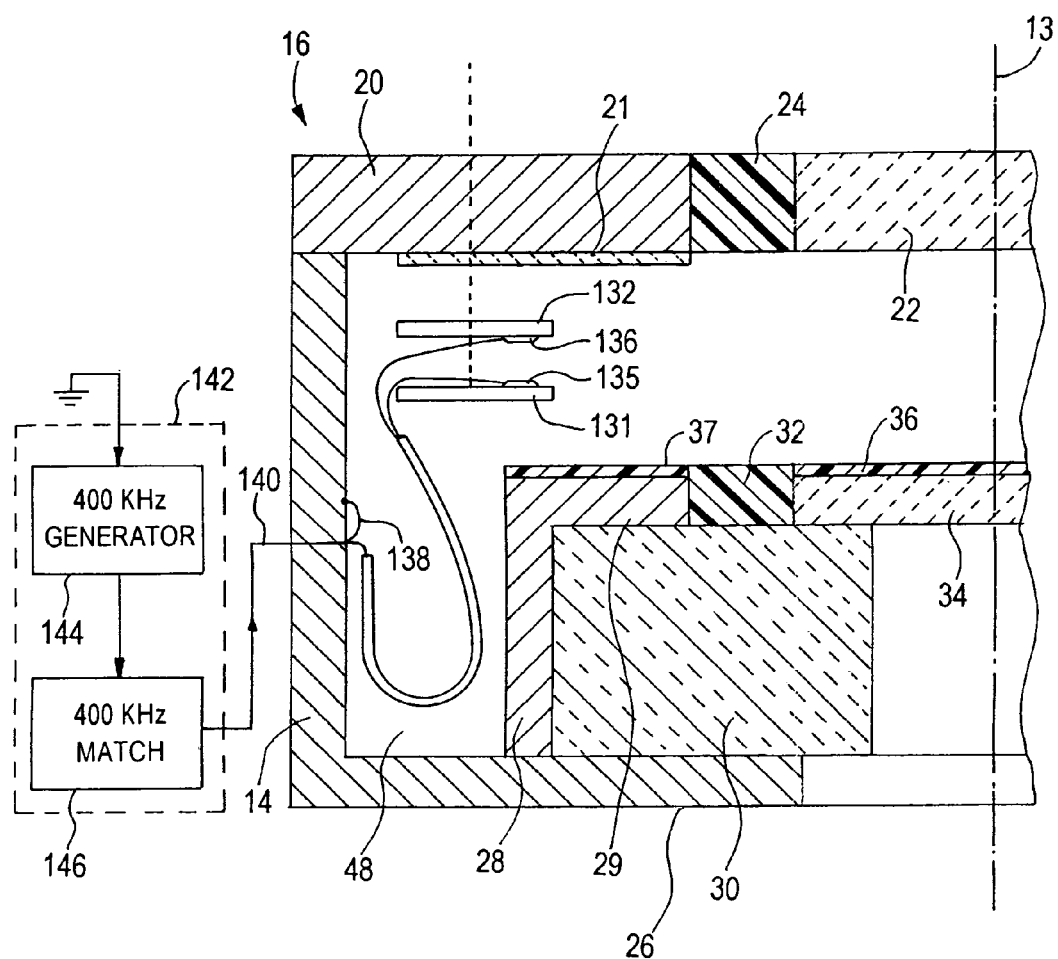
FIG. 4 is a schematic, cross-sectional diagram of a plasma processor including the features of another embodiment of the invention wherein a first ring-shaped electrode on a first louver is supplied with RF and a second ring-shaped electrode on a second louver is grounded.

Reference is now made to FIG. 4 of the drawing, an exploded view of a modified version of the apparatus illustrated in FIG. 1, wherein electrically insulating, fixed louver confinement rings 131 and 132 replace louver confinement rings 41-43. Louver rings 131 and 132 are positioned in radial alignment with respect to axis 13 and are vertically spaced from each other between the upper surface of ring 28 and ceiling 16 in the same manner that louvers 41-43 are positioned relative to ring 28 and ceiling 16 in FIG. 1. Louvers 131 and 132 include opposed, facing faces that respectively carry circular, vertically aligned electrodes 135 and 136, positioned so that the outer edges thereof are approximately aligned, in the vertical direction, with the vertically extending outer wall of ring 28. The inner edges of the electrodes 135 and 136 are inside the outer wall of ring 28. Electrodes 135 and 136 are covered by an electrical insulator, in the same manner that the electrodes of array 80 are covered. In the embodiment of FIG. 4, the electrodes of array 80 (FIG. 1) on ring 37 are replaced by electrodes 135 and 136 on louvers 131 and 132.

Electrode 135 is electrically grounded, by virtue of a connection thereof to grounded wall 14 by way of electrically conducting lead 138. Electrode 136 is connected to one end of lead 140 that extends through wall 14 and is electrically insulated from the wall. The end of lead 140 opposite from electrode 136 is connected to RF source 142, including single phase RF generator 144, that drives lead 140 and electrode 136 via matching network 146. In an actually constructed embodiment, generator 144 had a frequency of 400 KHz. Matching network 146 can include fixed components in many instances; alternatively, matching network 146 can include variable components that are changed in value in response to a suitable matching impedance detector circuit (not shown) of a conventional nature.

In operation, the RF electric field resulting from electrode 136 being excited by source 14 is coupled to grounded electrode 135 and ceiling 14. The RF fields established (1) between electrodes 135 and 136 and (2) between electrode 136 and ceiling 14 are of sufficient strength to augment the sheath effect between louvers 131 and 132 and between louver 132 and ceiling 16. The electric field strength, however, is not sufficient to cause plasma excitation in the region between louvers 131 and 132 and between louver 132 and ceiling 16.

In tests actually performed with the apparatus of FIG. 4, improved confinement was found to occur in response to electrodes 135 and 136 respectively being connected to ground and 400 KHz generator 144, compared to the confinement effect of louvers 131 and 132 without any electrical energization of electrodes 135 and 136.

Figure 5:
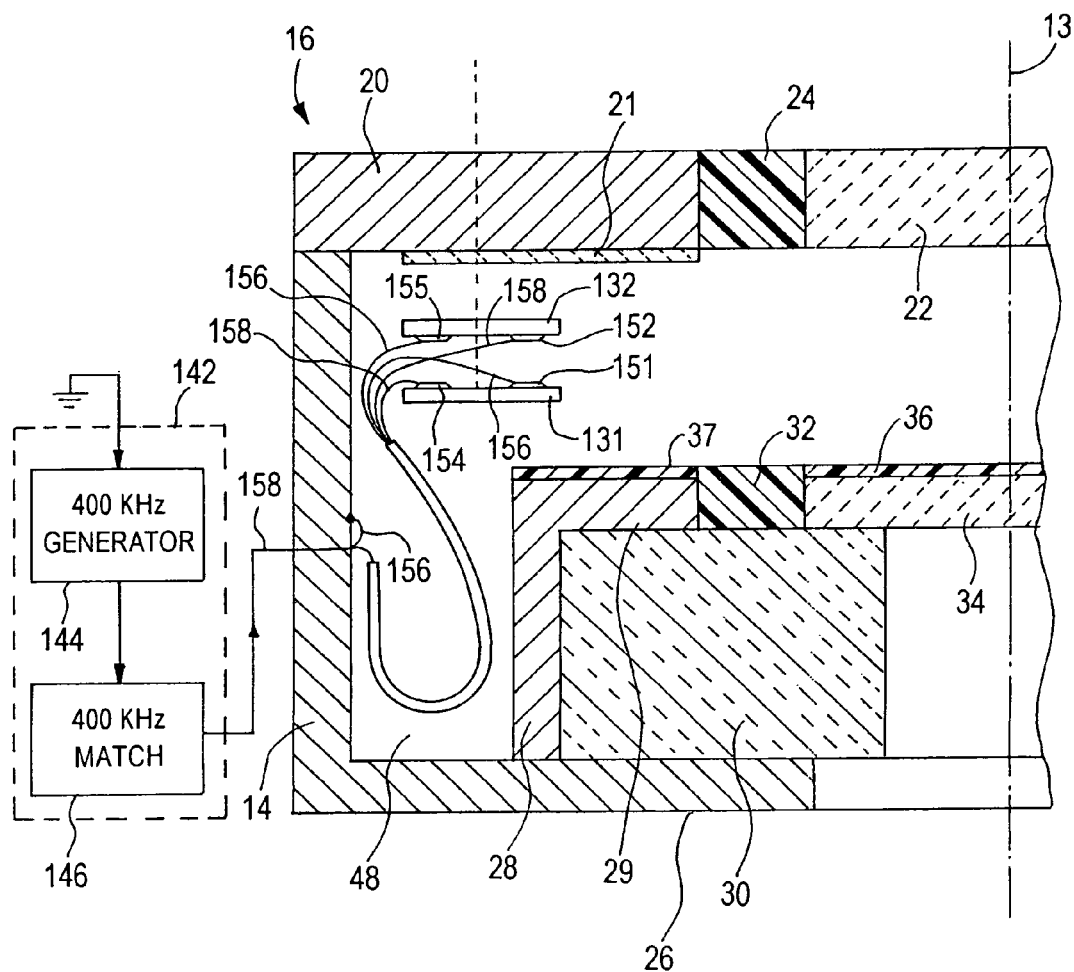
FIG. 5 is a schematic, cross-sectional diagram of a plasma processor including the features of a further embodiment of the invention wherein (a) first and second ring-shaped electrodes on a first louver are respectively connected to RF and ground, and (2) third and fourth-ring-shaped electrodes on a second louver are respectively connected to RF and ground.

Reference is now made to FIG. 5, an illustration of a modification of FIG. 4, which includes louvers 131 and 132. In the embodiment of FIG. 5, louvers 131 and 132 respectively carry electrodes 151 and 152, respectively positioned the same as electrodes 135 and 136. In the embodiment of FIG. 5, the opposed, facing faces of louvers 131 and 132 include a second set of circular electrodes 154 and 155, respectively. Louvers 154 and 155 are vertically aligned with each other and are radially spaced farther from axis 13 than vertically aligned electrodes 151 and 152. As such, the inner edges of circular electrodes 154 and 155 are outside the outer wall of ring 28, but are inside the outer edge of ceiling 16.

Electrodes 152 and 154 are electrically grounded by virtue of connections between electrodes 152 and 154 to grounded wall 14 by leads 156. Electrodes 152 and 154 are driven in parallel by the output of RF source 142, that is connected to electrodes 152 and 154 by way of leads 158, one of which extendings through and is electrically insulated from wall 14. In operation, the RF excitation applied to electrode 152 by source 142 causes an RF electric field to subsist between excited electrode 152 and grounded electrode 151. In addition, an RF electric field is established between excited electrode 152 and the grounded face of ceiling 16. An RF electric field is also established between excited electrode 154 and grounded electrode 155 and between excited electrode 154 and the grounded surface of metal ring 28. The RF electric fields augment the sheath effect between louvers 131 and 132 and ring 28, as well as ceiling 16, to enhance the confinement effect. The RF electric field strength, however, must be sufficiently low to prevent formation of plasma between the various surfaces carrying and in proximity to electrodes 151, 152, 154 and 155.

It is to be understood that electrodes 151, 152, 154 and 1555 can also be connected to ground and to a multiphase RF source, such that there is never a null electric field between electrodes 151, 152, 154 and 155. For example, electrodes 151 and 155 can be grounded and RF voltages having phases displaced from each other by 90° can be supplied to electrodes 152 and 154. Alternatively, electrode 154 can be grounded and RF voltages that are phase displaced from each other by 120° can be connected to electrodes 151, 152 and 155, respectively.

Figure 6:
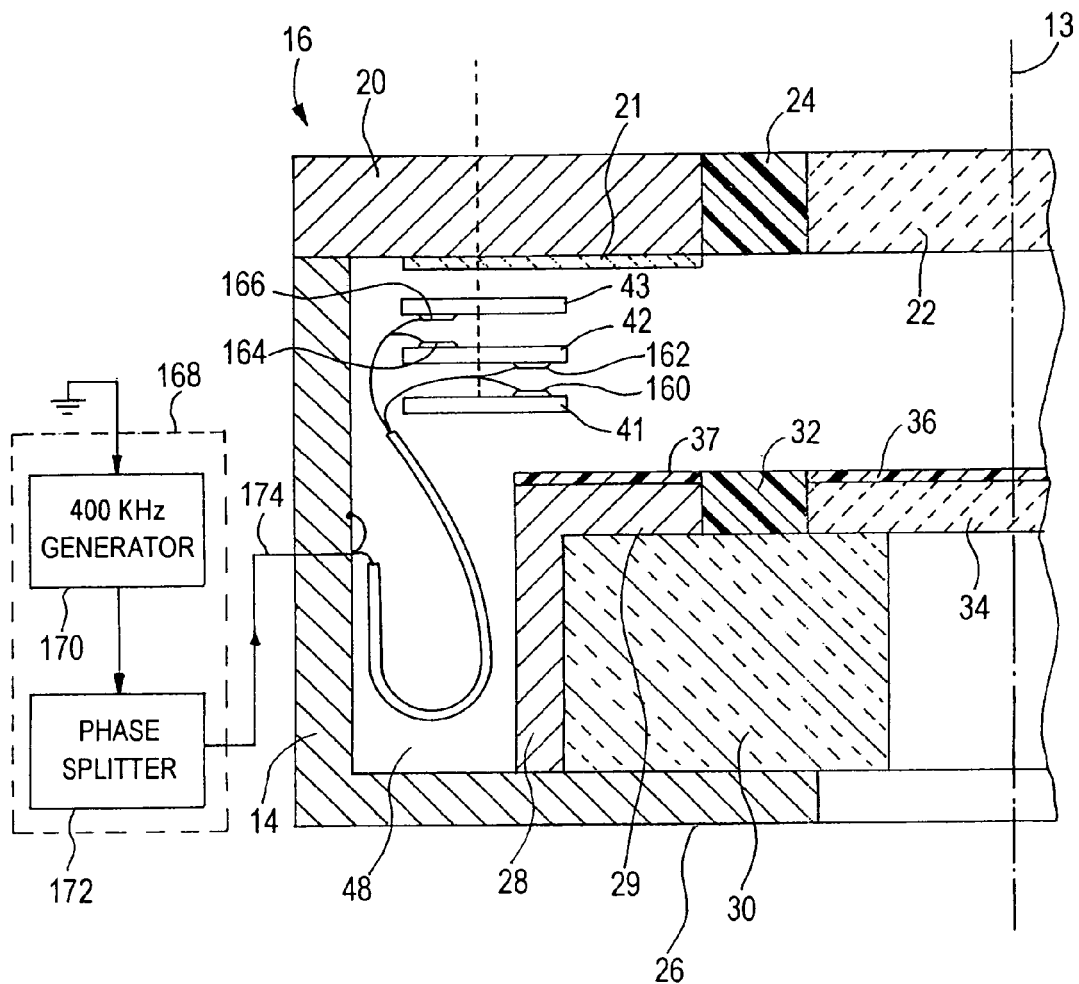
FIG. 6 is a schematic, cross-sectional diagram of a plasma processor including the features of an additional embodiment of the invention wherein ring-shaped electrodes are carried by three (i.e., several) louvers and some of the electrodes are grounded while other of the electrodes are driven by RF having different phases.

Reference is now made to FIG. 6, wherein the embodiment illustrated in FIG. 1 is modified so that the ring electrodes of array 80 on insulating ring 28 are removed and circular ring electrodes 160, 162, 164, and 166 are carried on the horizontal faces of insulating louver rings 41-43. Ring electrodes 160 and 162 are respectively carried by the upper and lower faces of insulating louver rings 41 and 42, while ring electrodes 164 and 166 are respectively carried by the upper and lower faces of insulating louver rings 42 and 43. Electrode rings 160 and 162 are vertically aligned so that the outer edges thereof are approximately aligned with the vertically extending outer wall of ring 28 and the inner edges thereof are located closer to central axis 13 than the outer wall of ring 28. Ring electrodes 164 and 166 are vertically aligned, so that the inner edges thereof are outside the outer wall of ring 28. The outer edges of ring electrodes 164 and 166 are further from central axis 13 than the inner edges of electrodes 164 and 166.

RF source 168, including 400 KHz generator 170 and 90° phase shifter or splitter 172, supplies RF energy to the electrodes of louvers 41-43. The RF energy is such that the thicknesses of the sheaths associated with louvers 41-43 is increased, without causing a plasma to subsist in the spaces between the louvers and between the portions of the chamber adjacent electrodes. Phase splitter 172 is arranged to supply to first and second leads of cable 174, first and second 90° phase displaced voltages having the frequency of generator 170. Phase splitter 172 also includes a grounded output lead. The phase displaced and grounded outputs of splitter 172 are supplied to cable 174 that extends through wall 14 into the interior of chamber 12, for connection to ring electrodes 160, 162, 164 and 166. In particular, the grounded lead of cable 174 is connected to ring electrodes 160 and 166, while the leads of cable 174 carrying the two phase displaced voltages are respectively connected to ring electrodes 162 and 164. Consequently, the electric fields between electrodes 160 and 162 are phase shifted 90° from the electric field between electrodes 164 and 166. As a result, there are no null electric fields in the regions between louver rings 41, 42 and 43, to enhance plasma confinement.

While there have been described and illustrated specific embodiments of the invention, it will be clear that variations in the details of the embodiments specifically illustrated and described may be made without departing from the true spirit and scope of the invention as defined in the appended claims. For example, the spacing between the louvers and the other structures can be fixed.

We claim:

1. A vacuum plasma processor comprising a processing chamber having a wall at a reference potential and an outlet port, a region in the chamber spaced from the wall and outlet port in which a plasma is adapted to be excited, a structure in the chamber for substantially confining the plasma to the region, an inlet of the chamber for enabling gas that forms the plasma to flow from a gas source into the region, the structure being arranged for converting the gas that flows into the region via the inlet into the plasma, the structure including a gap in the structure for enabling gas to flow from the region to the outlet port, and an AC electric power source having differing terminals respectively connected to differing spaced electric conductors on the structure for causing an AC electric field for confining the plasma to subsist in the gap and between the conductors, the electric field causing greater confining of the plasma to the region than is attained without electrically coupling power from the source to the conductors on the plasma confining structure.

2. The vacuum plasma processor of claim 1, wherein the structure includes at least three different conductors, the power arranged to be applied to the confining structure is RF and includes three phases separated by 120 degrees, the power source being arranged for simultaneously applying the three phases to said at least three different electric conductors on the structure.

3. The vacuum plasma processor of claim 1, wherein the structure includes at least two different conductors, the power arranged to be applied to the confining structure is RF and includes two phases separated by 90 degrees, the power source being arranged for simultaneously applying the two phases to said at least two different electric conductors on the structure.

4. The vacuum plasma processor of claim 3, wherein the confinement structure includes a member completely surrounding and concentric with the region in which the plasma is adapted to be excited, the member carrying first, second and third electrical conductors concentric with and completely surrounding the region, the third conductor completely surrounding the first and second conductors and being connected to the reference potential, the first and second conductors being connected to be responsive to the two phases.

5. The vacuum plasma processor of claim 4, wherein the member comprises a dielectric and the conductors are covered by a dielectric.

6. The vacuum plasma processor of claim 1, wherein the confinement structure includes at least one louver in stacked relationship with a member carrying at least one of the conductors, each of the louvers completely surrounding and being concentric with the region in which the plasma is adapted to be excited.

7. The vacuum plasma processor of claim 6, wherein the member and the louvers comprise rings coaxial with the region.

8. The vacuum plasma processor of claim 1, wherein the confinement structure includes at least one member completely surrounding the region in which the plasma is adapted to be excited; the at least one member carrying first, second, third and fourth electrical conductors completely surrounding the region; the fourth conductor completely surrounding the first, second and third conductors and being connected to the reference potential; and the first, second and third conductors being connected to be responsive to three phases of the RF source.

9. The vacuum plasma processor of claim 8, wherein the member comprises a dielectric and the conductors are covered by a dielectric.

10. The vacuum plasma processor of claim 9, wherein the member and the louver comprise rings coaxial with the region.

11. The vacuum plasma processor of claim 8, wherein the confinement structure includes a louver in stacked relationship with the member, the louver completely surrounding the region in which the plasma is adapted to be excited, and at least one of the louvers being capacitively coupled with the first, second and third electrical conductors.

12. The vacuum plasma processor of claim 8, wherein the member and the conductors are concentric with the region.

13. The vacuum plasma processor of claim 1, wherein (a) the region where the plasma is adapted to be excited includes first and second electrodes arranged to be electrically coupled to the plasma in the region and (b) the region and the confinement structure are arranged for causing a sheath to be between the confinement structure and the plasma, the sheath having a capacitance, the frequency of the AC electric power source being RF, and further including:

a further source connected to the first electrode for exciting the plasma to an RF frequency different from the RF frequency of the electric power source for coupling different electric voltages to the differing spaced electric conductors, and a series resonant circuit electrically connected between the second electrode and a terminal at the reference potential; the electrodes and the resonant circuit being arranged so that the capacitance of the sheath between the confinement structure and the plasma is included in the resonant circuit, the resonant circuit having a resonant frequency equal approximately to the frequency of the further source.

14. The vacuum plasma processor of claim 1, wherein the confinement structure completely surrounds the region where the plasma is adapted to be excited, at least one of the conductors completely surrounding the region.

15. The vacuum plasma processor of claim 14, wherein a plurality of the electrical conductors completely surround the region, at least another one of the plural conductors being at the reference potential.

16. The vacuum plasma processor of claim 15, wherein the at least one conductor and the another of the conductors are carried by a single member.

17. The vacuum plasma processor of claim 16, wherein the single member is mechanically connected in a fixed manner to the confinement structure.

18. The vacuum plasma processor of claim 16, further including a structure for holding a workpiece, the single member being mechanically connected in a fixed manner to the structure for holding the workpiece.

19. The vacuum plasma processor of claim 16, further including a structure for holding a workpiece, the single member being on a louver that is part of the confining structure and is spaced from and above the workpiece holding structure.

20. The vacuum plasma processor of claim 15, wherein the at least one conductor and another of the conductors are respectively on first and second different members of the confining structure.

21. The vacuum plasma processor of claim 20, further including a structure for holding a workpiece, the first and second different members respectively being first and second different plasma confinement louvers that are spaced by different distances above the workpiece holding structure.

22. The vacuum plasma processor of claim 21, wherein the at least one conductor and the another conductor are approximately aligned in the radial direction from a central axis of the region.

23. The vacuum plasma processor of claim 22, wherein the at least one conductor and the another conductor are connected to be responsive to voltages at first and second output terminals of the AC source.

24. The vacuum plasma processor according to claim 23, wherein the another conductor and second terminal are it the reference potential.

25. The vacuum plasma processor according to claim 23, wherein the at least one conductor and first terminal are connected to be responsive to a first phase of the AC source and the another conductor and second terminal are connected to be responsive to a second phase of the AC source.

26. The vacuum plasma processor according to claim 25, wherein the first louver includes a third conductor completely surrounding the at least one conductor and the second louver includes a fourth conductor completely surrounding the another conductor, the third and fourth conductors being connected to the reference potential.

27. The vacuum plasma processor of claim 26, wherein the first, second and third louvers respectively include fourth, fifth and sixth conductors respectively completely surrounding the at least one conductor, the another conductor and a third conductor.

28. The vacuum plasma processor of claim 27, wherein the at least one conductor, another conductor and third conductor are respectively connected to be responsive to the AC source and the fourth, fifth and sixth conductors are at the reference potential.

29. The vacuum plasma processor of claim 15, wherein the at least one conductor and at least another conductor are carried by first, second and third different members.

30. The vacuum plasma processor of claim 29, further including a structure for holding a workpiece, the first, second and third different members respectively being first, second and third different plasma confinement louvers that are spaced by different distances from the workpiece holding structure.

31. The processor of claim 1 wherein the electric power source and the confinement structure are such that ignition of gas passing through the confinement structure to the outlet port does not occur.

32. The processor of claim 1 wherein a plurality of the spaced conductors are in substantially the same horizontal plane of the structure, a first and a second of the spaced conductors in substantially the same horizontal plane being arranged so that the confining electric field extends between the first and second conductors.

33. The processor of claim 1 wherein a first and a second of the spaced conductors are respectively in a first and a second horizontal planes of the structure, the first and second spaced conductors being arranged so that the confining electric field extends between them.

34. The processor of claim 1 wherein a first and a second of the spaced conductors are in substantially the same first horizontal plane of the structure and a third and a fourth of the spaced conductors are in substantially the same second horizontal plane of the structure, the first, second, third and fourth spaced conductors being arranged so that a first confining electric field extends between the first and third conductors and a second confining electric field extends between the second and fourth conductors.

35. A vacuum plasma processor comprising a processing chamber having an inlet for connection to a source of gas that forms the plasma, a wall at a reference potential and an outlet port, a region in the chamber spaced from the wall and outlet port in which a plasma is adapted to be excited, a structure in the chamber for substantially confining the plasma to the region, the inlet and the region being arranged so that gas from the source flows through the inlet into the region, the region being arranged for converting the gas that flows into the region via the inlet into the plasma, the structure including (a) a gap for enabling gas to flow from the region to the outlet port and (b) an array of electric conductors arranged to be connected to a multiphase RF electric power source for applying RF electric fields having multiple phases always having a component with a value different from the reference potential to the gap, a sheath having a tendency to be formed between the plasma and the confining structure the electric power source, the array of electric conductors and the confining structure being arranged such that the applied RF electric fields are plasma confining electric fields of the confining structure; the plasma confining electric fields being sufficient to increase the size of the sheath within the confining structure compared to the size of the sheath that is formed between the plasma and the confining structure without the electric power source being connected to the confining structure.

36. The vacuum plasma processor of claim 35, wherein the RF source has a frequency and power level that is arranged to be applied to the confining structure for substantially preventing charge carriers between the confinement structure and the wall from being formed into a plasma.

37. The vacuum plasma processor of claim 36, wherein the frequency is an RF frequency of less than 4.0 MHz.

38. The vacuum plasma processor of claim 35, wherein the power arranged to be applied to the confining structure includes two phases separated by 90 degrees.

39. The vacuum plasma processor of claim 35, wherein the power arranged to be applied to the confining structure includes three phases separated by 120 degrees.

40. The processor of claim 35 wherein the electric power source and the confinement structure are such that ignition of gas passing through the confinement structure to the outlet port does not occur.

41. A vacuum plasma processor comprising a processing chamber having a wall at a reference potential and an outlet port, a region in the chamber spaced from the wall and outlet port in which a plasma is adapted to be excited, a structure in the chamber for confining the plasma to the region, an inlet of the chamber for enabling gas that forms the plasma to flow from a gas source into the region, the structure including a gap for enabling gas to flow from the region to the outlet port, the region being arranged for converting the gas that flows into the region via the inlet into the plasma, an electric power source connected to an electric conductor of the confining structure for causing an electric field for confining the plasma to subsist in the gap, the confining structure and the plasma confining electric field being arrange for substantially confining the plasma to the structure, a monitoring arrangement for effectively monitoring the extent of plasma confinement by the confinement structure, and a controller for controlling a parameter of the electric power applied to the plasma confining electric field based on an indication of the extent of plasma confinement by the confinement structure.

42. The vacuum plasma processor of claim 41, wherein the length of the gap is variable for controlling fluid flow from the region in which the plasma is adapted to be excited to the outlet port.

43. The vacuum plasma processor of claim 41, wherein the monitoring arrangement is arranged to derive an indication of the length of the gap.

44. The vacuum plasma processor of claim 41, wherein the controller is arranged to be responsive to the monitoring arrangement.

45. The vacuum plasma processor of claim 41, wherein the parameter includes voltage, the spacing between the first and second members being variable for controlling fluid flow from the region in which the plasma is adapted to be excited to the outlet port.

46. The processor of claim 41 wherein the electric power source and the confinement structure are such that ignition of gas passing through the confinement structure to the outlet port does not occur.

47. A vacuum plasma processor comprising a processing chamber having a wall at a reference potential and an outlet port, a region in the chamber spaced from the wall and outlet port in which a plasma is adapted to be excited, a structure in the chamber for confining the plasma to the region, an inlet of the chamber for enabling gas that forms the plasma to flow from a gas source into the region, the structure including a gap for enabling gas to flow from the region to the outlet port, the region being arranged for converting the gas that flows into the region via the inlet into the plasma, a plasma confining electric power source connected to an electric conductor of the confining structure for causing an electric field for confining the plasma to subsist in the gap, the confining structure and the electric field being arranged for substantially confining the plasma to the region, the length of the gap being variable for controlling fluid flow from the region where the plasma is adapted to be excited to the outlet port, a source for deriving an indication of the length of the gap, and a controller for controlling a parameter of the electric power applied to the plasma confining electric field based on an indication of the length of the gap.

48. The vacuum plasma processor of claim 47, wherein the controller is arranged to be responsive to the indication of the length of the gap.

49. The vacuum plasma processor of claim 47, wherein the parameter includes voltage.

50. The processor of claim 47 wherein the electric power source and the confinement structure are such that ignition of gas passing through the confinement structure to the outlet port does not occur.

* * * * *